United States Patent [19]
Jezo
[11] 3,927,384
[45] Dec. 16, 1975

[54] FREQUENCY SYNTHESIZER

[75] Inventor: Maurice Leon Jean Jezo, Cedar Grove, N.J.

[73] Assignee: International Telephone and Telegraph Corporation, Nutley, N.J.

[22] Filed: Aug. 20, 1974

[21] Appl. No.: 498,908

[52] U.S. Cl. .......... 331/2; 331/17
[51] Int. Cl.² .......... H03B 3/04
[58] Field of Search .......... 331/2, 17, 56

[56] References Cited

UNITED STATES PATENTS

| | | | |
|---|---|---|---|
| 3,277,389 | 10/1966 | Venn | 331/2 |
| 3,370,266 | 2/1968 | Taddeo et al. | 331/2 |

FOREIGN PATENTS OR APPLICATIONS

| | | | |
|---|---|---|---|
| 1,271,212 | 6/1968 | Germany | 331/2 |

*Primary Examiner*—John Kominski
*Attorney, Agent, or Firm*—John T. O'Halloran; Menotti J. Lombardi, Jr.; Alfred C. Hill

[57] ABSTRACT

A phase locked loop type of frequency synthesizer to generate simultaneously N output signals each having a different one of N different frequencies, where N is an integer greater than one, includes N voltage controlled oscillators each capable of generating simultaneously a different one of the N output signals and the major components of a single phase locked loop employed by each of the voltage controlled oscillators at different times. For each voltage controlled oscillator, a set of switches allows the phase locked loop to be closed through a desired voltage controlled oscillator or to isolate this voltage controlled oscillator from the loop. The switches are controlled in such a way that only one voltage controlled oscillator is in the loop at any given time. When a voltage controlled oscillator is isolated from the loop the control voltage to that voltage controlled oscillator is held at the same value as when the loop was closed by a sample and hold circuit which is coupled to control the voltage controlled oscillator when the oscillator is isolated from the loop. Therefore, the output signal frequency of a particular voltage controlled oscillator remains the same whether it is isolated from or in the loop. When the loop is closed through a particular voltage controlled oscillator, the divisor of a programmable binary divider included in the loop is set to obtain the desired output signal frequency.

11 Claims, 2 Drawing Figures

FREQUENCY SYNTHESIZER

BACKGROUND OF THE INVENTION

This invention relates to frequency synthesizers and more particularly to frequency synthesizers of the phase locked loop type.

In frequency synthesizers, the output signal frequency reflects the characteristics of one or more frequency sources and it is possible to choose the output signal frequency from a large number of possible frequencies.

Where high prerformances are required, a frequency synthesizer allows high quality for every output signal frequency with a single high performance oscillator.

In the prior art the usual frequency synthesizer of the phase locked loop type provides only one output signal frequency at any given time. In the systems which use simultaneously several signals of different frequencies, a corresponding number of phase locked loop type frequency synthesizers are usually provided.

SUMMARY OF THE INVENTION

An object of the present invention is to provide a frequency synthesizer of the phase locked loop type generating simultaneously several output signal frequencies at a nominal cost for each additional output signal frequency relative to the above mentioned prior art technique.

Another object of the present invention is to provide a frequency synthesizer of the phase locked loop type to simultaneously generate a plurality of different output signal frequencies at a nominal cost for each additional output signal frequency relative to the above mentioned prior art technique by time sharing essential components of a single phase locked loop.

A feature of the present invention is the provision of a phase locked loop type of frequency synthesizer to generate simultaneously N output signals each having a different one of N different frequencies, where N is an integer greater than one, comprising: N voltage controlled oscillators each capable of generating simultaneously a different one of the N signals; first means to produce N control signals at different times, each of the N control signals being for a different one of the N oscillators; second means to selectively couple the output of the N oscillators at different times to the input of the first means; N third means each associated with a different one of the N oscillators to store that one of the N control signals controlling the associated one of the N oscillators; and fourth means to selectively couple the output of the first means to the control input of that one of the N oscillators whose output is coupled to the input of the first means, to couple the output of the first means to the input of that one of the N third means associated with the one of the N oscillators, to disconnect the control input of the one of the N oscillators from the first means when the output of the first means has been connected to another of the N oscillators and its associated one of the N third means, and to connect the output of the one of the N third means to the control input of the one of the N oscillators to enable simultaneous generation of the N output signals.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERED EMBODIMENT

Figure 1:
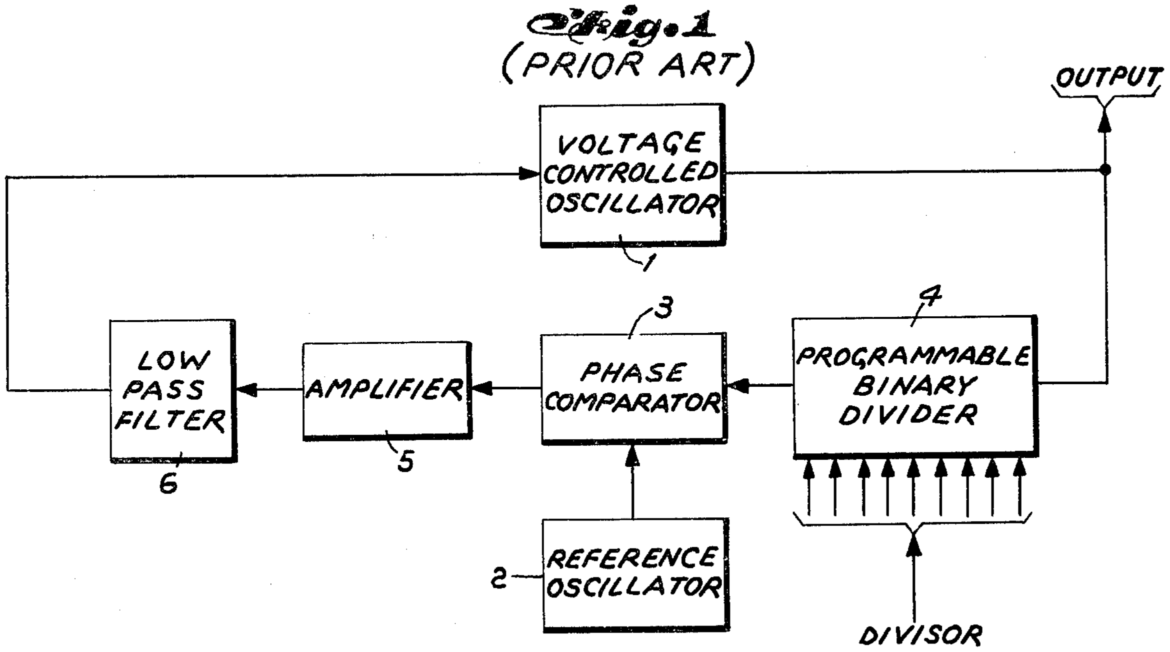
Fig. 1 (PRIOR ART)
FIG. 1 is a block diagram of a prior art phase locked loop type of frequency synthesizer capable of providing only one output frequency at a time.

Referring to FIG. 1, there is illustrated therein a block diagram of a prior art phase locked loop type frequency synthesizer including a voltage controlled oscillator 1 which is phase locked to a high performance reference oscillator 2. The voltage controlling the voltage controlled oscillator 1 is derived by a phase comparison in phase comparator 3 between the output signal of oscillator 2 and the output signal of oscillator 1 after suitable frequency division in programmable binary divider 4. Different frequencies are obtained by division of the output signal frequency of oscillator 1 by different divisors being provided in divider 4. The output signal of phase comparator 3 is amplified in amplifier 5 and passed through a low pass filter 6 before it is applied to the control input of oscillator 1. The usable output is the output signal of oscillator 1, which provides only one output signal frequency at any given time.

Figure 2:
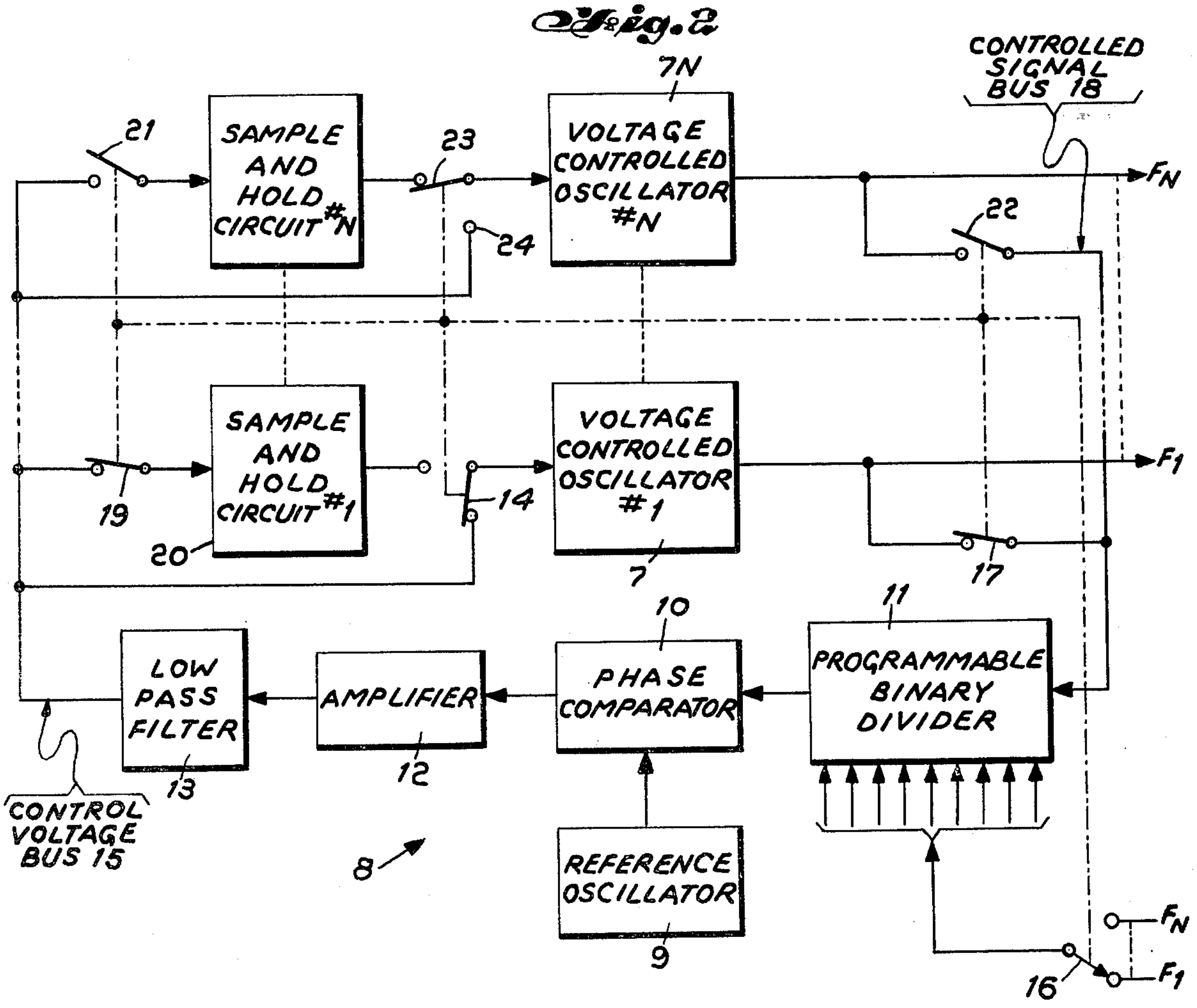
FIG. 2 is a block diagram of a phase locked loop type of frequency synthesizer capable of generating simultaneously a plurality of different output signal frequencies in accordance with the principles of the present invention.

Referring to FIG. 2, there is illustrated therein a frequency synthesizer of a phase locked loop type generating simultaneously N output signals each having a different one of N different frequencies, where N is an integer greater than one, in accordance with the principles of the present invention. Each of the N voltage controlled oscillators 7–7N provide one of the output signal frequencies and are capable of providing these output frequency signals simultaneously. Oscillators 7–7N are controlled by a single phase locked loop 8 including reference oscillator 9, phase comparator 10, programmable binary divider 11, amplifier 12, and low pass filter 13.

Oscillators 7 and 9, comparator 10, amplifier 12 and filter 13 are well known in the art and need no further illustration or description of an implementation thereof. Divider 11 may be implemented in many different ways with one implementation being fully disclosed in the copending application of Arnold J. Seipel et al, Ser. No. 387,079, filed Aug. 9, 1973, assigned to the same assignee as the present application. The disclosure of this copending application is incorporated herein by reference.

Let us assume now that voltage controlled oscillator 1 is connected into loop 8. This is accomplished by switch 14 connecting the control voltage bus 15 to the control input of oscillator 7, by switch 16 feeding the division factor for $F_1$ to programmable binary divider 11 and by switch 17 connecting the output of oscillator 7 to the controlled signal bus 18. Switch 19 connects the input of sample and hold circuit 20 to bus 15. The synthesizer with this connection is operating in the same way as the single output frequency synthesizer of FIG. 1 with the single output signal frequency being taken from oscillator 7. Sample and hold circuit 20 will hold or store the control voltage on bus 15 applied to the control input of oscillator 7.

When oscillator 7 is isolated from loop 8, switches 19 and 17 are opened and switch 14 connects the control input of oscillator 7 to the output of circuit 20. Since circuit 20 is holding the voltage of the bus 15 which was controlling oscillator 7 when in the loop, oscillator 7 will still put out an output signal frequency $F_1$ and will continue to do so as long as the voltage in circuit 20 remains unchanged.

Loop 8 is now available to control another of the N oscillators such as oscillator 7N by closing switches 21 and 22 and by moving switch 23 to contact 24 so as to feed the control voltage on bus 15 to the control input of oscillator 7N and by moving switch 16 to the $F_N$ position.

When this occurs, their are two output signal frequencies of different values being simultaneously generated by the frequency synthesizer of the present invention. The number of voltage controlled oscillators 7 which can be controlled by a single loop on a time shared basis is limited only by practical consideration of the duty cycle of the utilization of loop 8 necessary to achieve required performance.

It should be immediately apparent that the frequency synthesizer of the present invention as illustrated in FIG. 2 will provide simultaneously a number of signals at different frequencies and can replace the corresponding number of conventional phase locked loop frequency synthesizers as illustrated in FIG. 1.

While I have described above the principles of my invention in connection with specific apparatus it is to be clearly understood that this description is made only by way of example and not as a limitation to the scope of my invention as set forth in the objects thereof and in the accompanying claims.

I claim:

1. A phase locked loop type of frequency synthesizer to generate simultaneously N output signals each having a different one of N different frequencies, where N is an integer greater than one, comprising:

N voltage controlled oscillators each capable of generating simultaneously a different one of said N signals;

first means to produce N control signals at different times, each of said N control signals being for a different one of said N oscillators;

second means to selectively couple the output of said N oscillators at different times to the input of said firt means;

N third means each associated with a different one of said N oscillators to store that one of said N control signals controlling the associated one of said N oscillators; and fourth means to selectively couple the output of said first means to the control input of that one of said N oscillators whose output is coupled to the input of said first means, to disconnect the output of that one of said N third means associated with said one of said N oscillators from the control input of said one of said N oscillators, to couple the output of said first means to the input of said one of said N third means, to disconnect the control input of said one of said N oscillators from said first means when the output of said first means has been connected to another of said N oscillators and its associated one of said N third means, and to connect the output of said one of said N third means to the control input of said one of said N oscillators to enable simultaneous generation of said N output signals.

2. A frequency synthesizer according to claim 1, wherein said first means includes a reference oscillator providing a reference signal having a given frequency, a programmable binary divider selectively coupled by said second means to the output of each of said N oscillators at different times, said divider having its dividing factor selected in accordance with which of said N different frequencies are coupled thereto, a phase comparator coupled to said reference oscillator and said divider to compare the phase of the output signal of said divider to the phase of said reference signal to produce said N control signals, an amplifier coupled to the output of said comparator, and a low pass filter coupled to the output of said amplifier, the output of said filter being the output of said first means.

3. A frequency synthesizer according to claim 2, wherein said second means includes N switches.

4. A frequency synthesizer according to claim 3, wherein each of said N third means includes a sample and hold circuit.

5. A frequency synthesizer according to claim 4, wherein said fourth means includes N first switches each to connect and disconnect the input of a different one of said N sample and hold circuits to the output of said low pass filter, and N second switches each to connect the control input of a different one of said N oscillators to the output of said low pass filter and to connect the output of a different one of said N sample and hold circuits to the control input of an associated one of said N oscillators when the control input of said associated one of said N oscillators is disconnected from the output of said low pass filter.

6. A frequency synthesizer according to claim 1, wherein said second means includes N switches.

7. A frequency synthesizer according to claim 6, wherein each of said N third means includes a sample and hold circuit.

8. A frequency synthesizer according to claim 7, wherein said fourth means includes N first switches each to connect and disconnect the input of a different one of said N sample and hold circuits to the output of said first means, and N second switches each to connect the control input of a different one of said N oscillators to the output of said first means and to connect the output of a different one of said N sample and hold circuits to the control input of an associated one of said N oscillators when the control input of said associated one of said N oscillators is disconnected from the output of said first means.

9. A frequency synthesizer according to claim 1, wherein each of said N third means includes a sample and hold circuit.

10. A frequency synthesizer according to claim 9, wherein said fourth means includes N first switches each to connect and disconnect the input of a different one of said N sample and hold circuits to the output of said first means, and N second switches each to connect the control input of a different one of said N oscillators to the output of said first means and to connect the output of a different one of said N sample and hold circuits to the control input of an associated one of said N oscillators when the control input of said associated one of said N oscillators is disconnected from the output of said first means.

11. A frequency synthesizer according to claim 1, wherein said fourth means includes N first switches each to connect and disconnect the input of a different one of said N third means to the output of said first means, and N second switches each to connect the control input of a different one of said N oscillators to the output of said first means and to connect the output of a different one of said N third means to the control input of an associated one of said N oscillators when the control input of said associated one of said N oscillators is disconnected from the output of said first means.

* * * * *